United States Patent [19]

Walton

[11] Patent Number: 5,396,619
[45] Date of Patent: Mar. 7, 1995

[54] SYSTEM AND METHOD FOR TESTING AND REMAPPING BASE MEMORY FOR MEMORY DIAGNOSTICS

[75] Inventor: Scott D. Walton, Boynton Beach, Fla.

[73] Assignee: International Business Machines Corporation, Armonk, N.Y.

[21] Appl. No.: 97,761

[22] Filed: Jul. 26, 1993

[51] Int. Cl.[6] .................. G06F 11/00; G11C 29/00
[52] U.S. Cl. ............................ 395/575; 371/21.1
[58] Field of Search ............. 371/21.1, 21.2, 10.1, 371/10.2; 395/575

[56] References Cited

U.S. PATENT DOCUMENTS

| | | | |
|---|---|---|---|
| 4,191,996 | 3/1980 | Chesley | 364/200 |
| 4,430,727 | 2/1984 | Moore et al. | 364/900 |
| 4,586,178 | 4/1986 | Bosse | 371/10 |
| 5,101,409 | 3/1992 | Hack | 371/21.3 |
| 5,327,363 | 7/1994 | Akiyama | 364/580 |
| 5,327,550 | 7/1994 | Pribnow | 395/575 |

Primary Examiner—Charles E. Atkinson
Attorney, Agent, or Firm—Calfee Halter & Griswold

[57] ABSTRACT

A method and system is provided for a computer system for testing base memory in which the computer system's operating system resides. The operating system is initially run out of the base memory in a first memory bank. A mapping scheme establishes a correspondence between physical addresses in the first memory bank and in a second memory bank, and logical addresses which map to the physical addresses in the first and second memory banks. The contents of the base memory from the first memory bank are copied to the second memory bank, and operation of the operating system from the base memory in the first memory bank is switched to the base memory copied into the second memory bank. After a memory test is performed on the first memory bank, the copied contents of the base memory are re-copied from the second memory bank back into the first memory bank, and operation of the operating system is switched back to the re-copied base memory in the first memory bank.

18 Claims, 4 Drawing Sheets

SYSTEM AND METHOD FOR TESTING AND REMAPPING BASE MEMORY FOR MEMORY DIAGNOSTICS

FIELD OF THE INVENTION

The present invention relates generally to memory diagnostic test features in computers and more particularly to a method and system for testing the base memory of a computer in which resides the operating system for the computer.

BACKGROUND OF THE INVENTION

Memory diagnostic programs are used in computer systems to detect and identify faults or errors in memory subsystems of computers. Typically, memory diagnostic programs test memory by writing specific data patterns to memory, then reading back these patterns for verification. A diagnostic control program (DCP) is often utilized to manage the operation of the memory diagnostic programs. Because the specific data patterns written to memory in these types of read/write tests are written over whatever data is currently present in the memory, this read/write testing process is referred to as destructive testing because it destroys the contents of the memory being tested.

The base memory of a computer system typically includes the computer's operating system (e.g., DOS ®, Windows ®, etc.) as well as a diagnostic control program (DCP) and at least one memory diagnostic program. When diagnostic memory tests are run, this base memory (0–640 KB in the IBM ® PS/2 ® system) cannot be read/write tested for faults or errors like other memory in the system because the operating system, the DCP, and the diagnostic programs, all of which are required to run the tests, reside therein. Any attempt at destructively testing the base memory of a system, then, would terminate operation of the operating system, and hence the computer.

Typically, this base memory is read-only tested, wherein the contents of the base memory are read, but not written over with specific data patterns which may be read back and compared to the written data. For example, the diagnostics included on many reference diskettes provided with personal computer systems do not perform a thorough, read/write test on the system base memory. Such known read-only base memory diagnostics are not as effective in detecting and identifying base memory failures as are destructive read/write tests.

In many computer systems, the operating system, the DCP, and the memory diagnostic programs cannot be operated outside the base memory (physical addresses 0–640 KB) of the computer because operating systems such as DOS ® require that they be addressed in the base memory (0–640 KB). It is important, however, to subject base memory to the same rigorous read/write destructive testing as is the other memory in the system. Accordingly, there is a need for a mechanism by which base memory, which includes the operating system for a computer, to be read/write tested while meeting the addressing requirements of the operating system.

The base memory which requires this read/write testing is often implemented, for example in the IBM ®PS/2 ® system, utilizing single in-line memory modules (SIMMs). SIMMs typically comprise a small circuit board to which are attached one or two banks of dynamic random access memory (DRAM) chips. The DRAM chips contain the memory cells which are used for storage. The sizes of SIMMs vary, and are in part dependent on the number and size of the DRAMs used to construct them. For example, a 1 MB SIMM comprises a single bank of 1 MB DRAMs, a 4 MB SIMM comprises a single bank of 4 MB DRAMs, and an 8 MB SIMM is constructed from two banks of 4 MB DRAMs. Bank sizes vary, but are typically comprised of between eight and ten DRAMs. In the future, it is likely that SIMM architecture will provide 16 and 32 MB SIMMs comprised of 16 MB DRAMs.

Base memory comprised of SIMMs should be thoroughly tested for a variety of errors. One type of error, referred to as a cell disturbance or "crosstalk" failure, is dependent on the internal structure of these DRAM chips, which varies by manufacturer. Crosstalk occurs between two physically adjacent cells, when a first cell is written to and the contents of an adjacent cell are changed as a result of writing to the first cell. Such "crosstalk" cannot be detected by reading only the first cell.

It is important that individual banks of DRAMs which make up a particular SIMM be tested in their entirety in order to uncover crosstalk failures. Although DRAM memory cells are logically addressed by the operating system in sequential order, the physical layout of the memory chip is often such that two memory cells that are physically adjacent to each other on the DRAM chip may not have logical addresses which are adjacent. Accordingly, if the entire memory bank is not tested during a single test, crosstalk failures between cells that are physically adjacent but which do not have adjacent addresses will not be uncovered.

In "A Unique Data Pattern, Generation Algorithm, and Application Methodology for Testing Read/Write Storage Facilities", IBM Technical Disclosure Bulletin, Vol. 33, No. 12, May 1991, R. G. Iseminger discusses crosstalk memory failures and outlines a memory test which will locate and identify these failures in SIMM memory modules regardless of the internal structure of the memory. However, Iseminger does not solve the problem of completely read/write testing the SIMM modules which comprise the base memory of the system and which contain the operating system, the DCP, and the memory diagnostic programs.

Because SIMM memory bank sizes of 1 MB and 4 MB are standard, the minimum amount of base memory that does not receive complete read/write testing is 1 MB. In the case of two-way interleaved memory, two individual SIMM banks are combined to create one memory bank which is twice the size of the individual SIMM banks. For a system using two-way interleaved memory involving SIMM bank pairs, such as the IBM ® PS/2 ® Models 90 486 and 95 486, the minimum memory size not read/write tested is 2 MB and the worst case is 8 MB. With the possibility of future systems employing larger SIMM banks, or using 4-way interleaving, the situation will only worsen.

Thus it is an object of the present invention to provide a method and system in a computer system for testing base system memory in which the computer's operating system resides, utilizing a full read/write test. It is a further object of the invention to provide such a system and method which may be utilized on base memories comprised of SIMM memory banks and which test the SIMM banks in their entirety.

SUMMARY OF THE INVENTION

The present invention provides a system and method for read/write testing of base memory in a computer wherein resides the operating system for the computer. The system and method may be implemented in computer systems built around microprocessors provided with a paging feature. Paging permits the contents of the base memory, including the operating system, to be copied out of a first physical address in a first memory bank to a second physical address in a second memory bank, while retaining the same logical address for both physical address locations. In this manner, the base memory in the first memory bank may be read/write tested while the operating system is operating out of the second memory bank.

Paging tables are created in the processor-controlled main memory which maps the same logical address for the base memory to the second physical address in the second memory bank, when paging is enabled. When paging is not enabled, the operating system operates out of the first memory bank. The microprocessor does not utilize the paging tables because in a non-paging mode the physical and logical addresses for the base memory are identical. However, when paging is enabled, the operating system can operate out of the second memory bank in which a copy of the operating system resides. The microprocessor uses the paging tables to translate the same logical address of the base memory to its new physical address in the second memory bank. Such an addressing scheme permits the operating system, the DCP, and the memory diagnostics to continue to run from the copy of the base memory in the second memory bank while read/write testing is performed on the first memory bank. When the testing is complete, the copy of the base memory is re-copied back to the first memory bank, paging is disabled, and the operating system may again be operated out of the first memory bank.

DETAILED DESCRIPTION OF THE PREFERRED EMBODIMENT

The present invention provides a system and a method for testing a base memory bank in a computer in which resides the operating system for the computer, without irretrievably destroying the portion of the operating system in main memory during the test. The invention also performs such testing in a manner which will detect crosstalk failures between memory cells in the base memory bank which are physically adjacent to each other but which do not have adjacent addresses.

The invention may be implemented in the memory diagnostics of any computer system having a microprocessor which supports paging. Paging permits mapping of the same logical address, which corresponds to a first physical address in a non-paging mode, to a second physical address in a paging mode. In the preferred embodiment, the invention is implemented in an IBM ® PS/2 ® (or IBM ® PS/2 ® compatible) computer system which operates on the MicroSoft ® DOS ® operating system, and which includes an Intel ® 386SX ®, 386DX ®, or 486 ® microprocessor, or any higher order microprocessor in the X86 family. Lower order X86 microprocessors, such as the 8086 and 80286, do not support paging, and thus will not support the invention.

Paging generally refers to the transfer of memory pages between real storage and auxiliary storage, and is described more fully in *Intel Corp. 386DX Microprocessor Programmer's Reference Manual*, 1989; and *Intel Corp. I486DX Microprocessor Programmer's Reference Manual*, 1989. In general, the paging feature in these microprocessors provides a means by which a user may map a logical address in system memory to more than one physical address in the memory. The memory is divided into pages, the size of which depends on the microprocessor. For example, in the Intel ® 386 and 486 microprocessors, pages are typically defined in 4 KB memory blocks.

Figure 1:
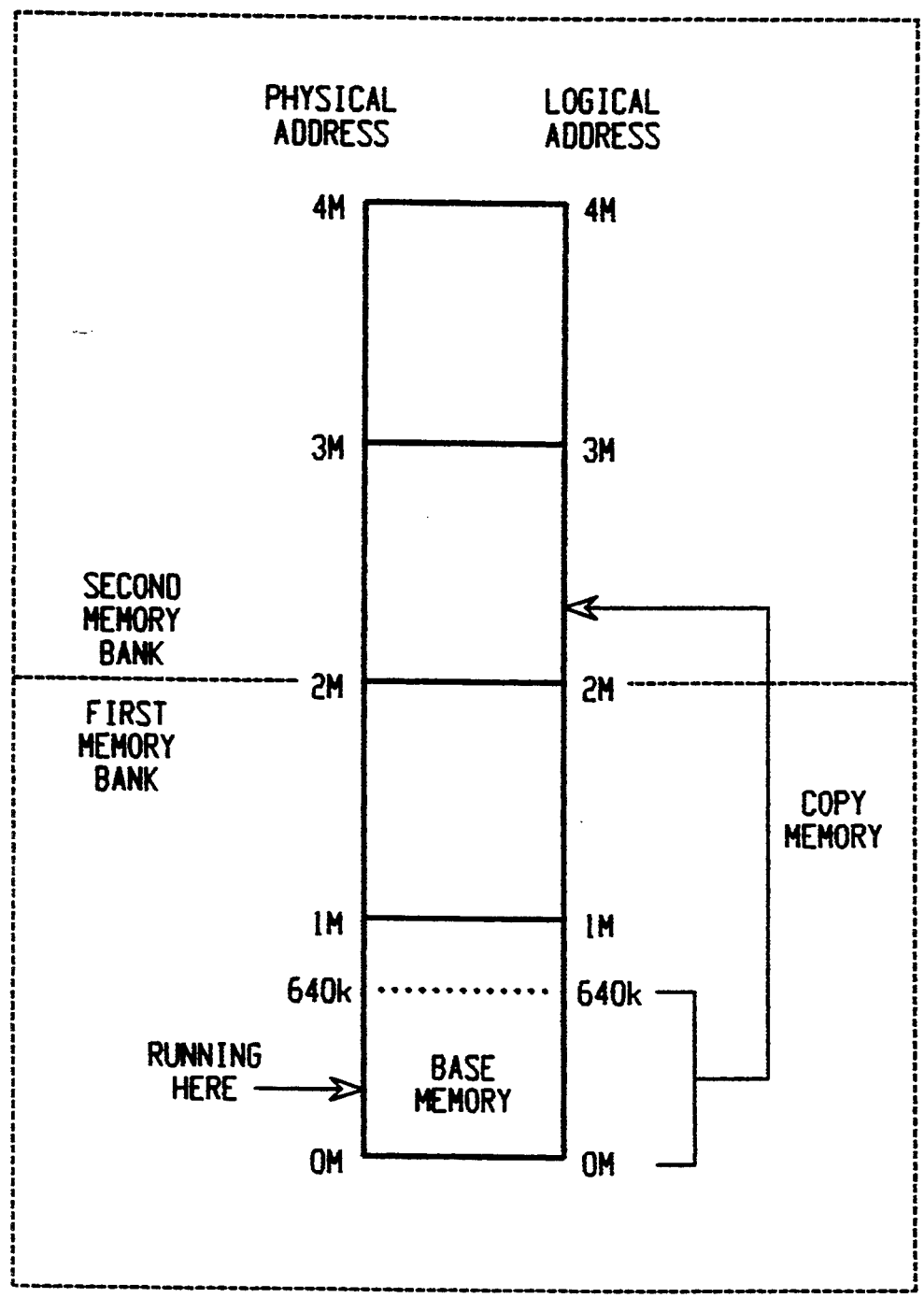
FIG. 1 is a block diagram of the base memory in a computer system which may be tested by the system and method of the present invention, shown as functioning prior to performance of the test.
Figure 2:
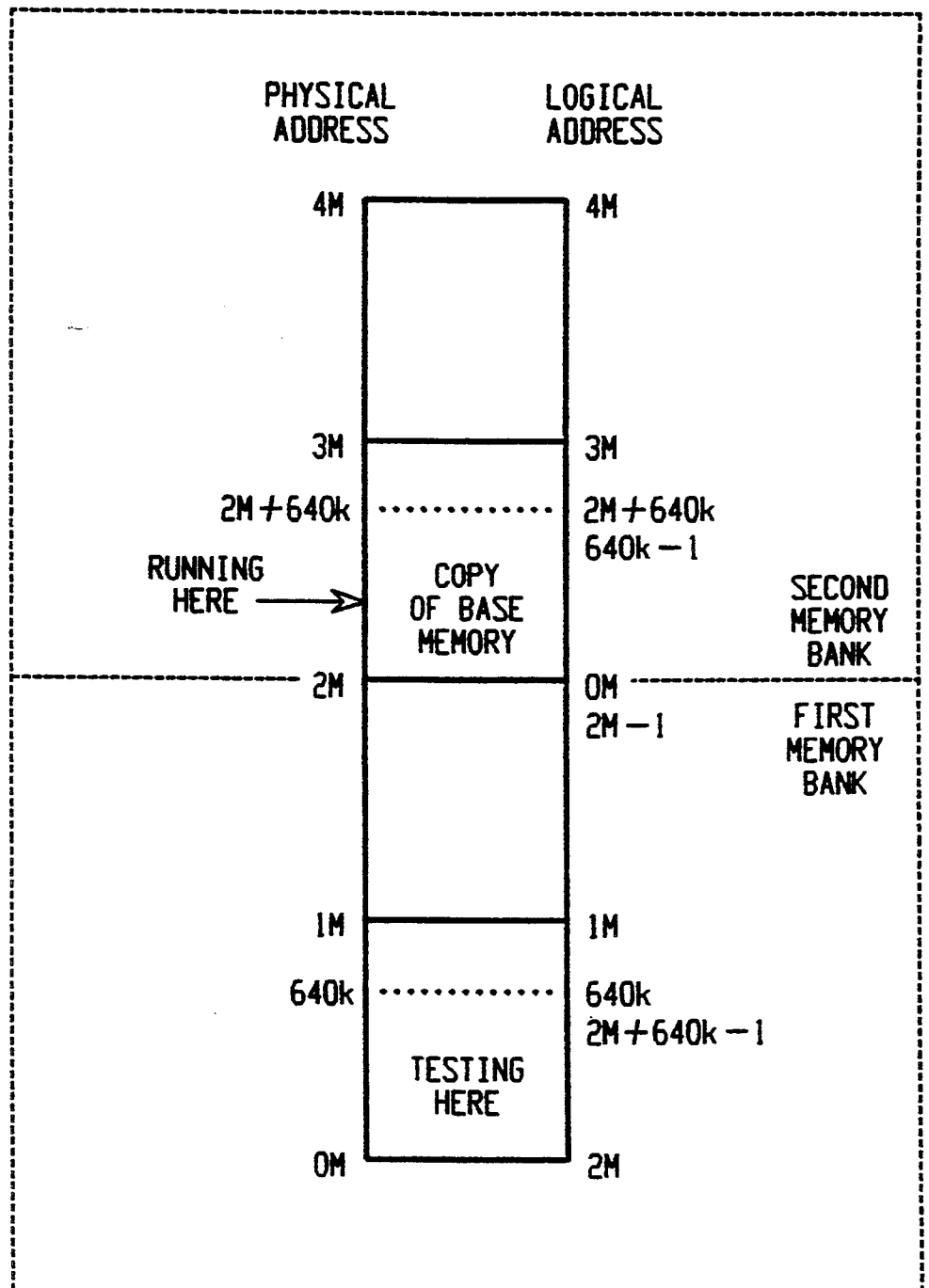
FIG. 2 is a block diagram of the base memory in a computer system which may be tested by the present invention, shown as functioning during the test.

FIGS. 1 and 2 are block diagrams showing a portion of the memory in a computer system in which the present invention may be implemented. Four megabytes (4 MB) of memory are shown in each of FIGS. 1 and 2. These 4 MB represent the same physical memory hardware in each of the Figures. FIG. 1 represents the memory in a non-paging mode, wherein the logical and physical addresses for the memory are identical, and FIG. 2 represents the memory in a paging mode, wherein logical addresses are mapped to different physical addresses, as further described below.

The physical memory of FIGS. 1 and 2 is segmented as follows. The first 2 MB of physically addressable memory (physical addresses 0 to 2 MB−1) comprise a first bank of memory in which the base memory including the operating system resides. The upper 2 MB of memory (physical addresses (2 MB to 4 MB−1) comprise a second memory bank. The memory scheme shown by FIG. 2 could represent a two-way interleaved scheme with 1 MB SIMM banks (and, therefore, 2 MB memory banks). Each of the memory banks comprises a plurality of dynamic random access memory (DRAM) chips which are provided with memory bit cells used for storage. The memory cells have a predetermined layout which is fixed on the chip. A physical address scheme corresponds to the physical address locations on the chip.

Of course, the computer system in which the invention is implemented will include more memory than the 4 MB shown. The 4 MB shown is merely to illustrate (i) a first memory bank of the system wherein base memory (including the operating system such as DOS ®) originally resides, and (ii) a second memory bank of the system wherein base memory is copied prior to testing the first memory bank.

As shown in FIG. 1, the physical addresses corresponding to the individual memory cells on the DRAM chips comprising the memory and the logical addresses used by the microprocessor to access these physical addresses are the same. Operating systems such as DOS ® require that base memory, which includes the operating system, must be logically addressed at 0–640 KB. In the present invention, the operating system (DOS ®), the diagnostic control program (DCP), and the memory diagnostic programs reside between these physical addresses. The DCP is a management program which handles services for the individual diagnostics programs, for example placing the test menu and calling and loading any selected tests.

The present invention provides a mechanism wherein the operating system, originally residing in the first memory bank, is copied to the second memory bank so that the first memory bank can be tested, in a manner as hereinafter described. Initially, a page directory is initialized in the memory for page tables which are required by the microprocessor to create the desired mapping of logical addresses to physical addresses. The page tables in the memory are initialized in the following manner. The base memory containing the operating system is originally physically located in the first memory bank of the system, as shown in FIG. 1, which first memory bank requires the read/write testing provided by the present invention. Accordingly, this base memory (0–640 KB physical address and logical address) is provided with an alternate physical address in the second memory bank which will become valid in the paging mode of operation. While the operating system is operating out of the base memory located in the first memory bank, page tables in the memory are created which map the same logical address for the base memory (0–640 KB), which corresponds to the same physical address in a non-paging mode, to a second physical address in the second memory bank when paging is enabled.

The second physical address which is assigned to the same logical address must be physically outside the first SIMM memory bank containing the base memory so that the SIMM bank may be thoroughly and completely tested using conventional memory diagnostics. Accordingly, as shown in FIG. 2, the same logical addresses (0–640 KB) are mapped to physical addresses 2 MB to (2 MB+640 KB) in a paging enabled mode as correspond to physical addresses 0 to 640 KB in a non-paging mode. Similarly, the same logical addresses (2 MB to (2 MB+640 KB)) are mapped to physical addresses 0–640 KB in a paging enabled mode as correspond to physical addresses (2 MB to (2 MB+640 KB)) in a nonpaging mode. These corresponding logical to physical address mappings are contained in the page tables in the main memory. Page tables are maintained in the main memory (SIMMs) and also must be located outside the bank to be tested. All other available addresses ((640 KB+1) to (2 MB−1) in the first SIMM bank are mapped to each other, meaning that the physical and logical addresses for these available addresses are the same in both paging and non-paging modes of operation. In the case of DOS ®, these addresses are used for ROM address space, video Ram address space, BIOS code address space, etc. All other logical memory in the page tables may be left empty (not present), as remapping for these addresses is not necessary.

With the logical to physical addressing mapped out in the paging tables in the memory, the base memory (0–640 KB) can now be copied from the first memory bank, while the operating system is operating out of this first memory bank, to the second memory bank (physical addresses (2 MB to (2 MB+640 KB)). The copied base memory includes the operating system, the DCP and the diagnostic control programs.

With the base memory now copied out of the first SIMM bank in which it originally resided, the paging mode of the microprocessor may now be enabled. Given a logical address, the processor translates it, using the page tables, into a physical address via the paging feature. The operating system, now operating out of the copied version of the base memory, may address the first SIMM bank using the paging tables. The copied base memory will be accessed using the logical addresses that map to it in its new physical location.

Memory diagnostics may now be run on the entire first SIMM bank wherein the operating system first resided, for example, by running a conventional read/write diagnostic test. Because the entire SIMM bank is available, a complete test for crosstalk failures may be performed. A destructive read/write test may be performed on the entire SIMM bank because the operating system, the DCP and the diagnostic control programs have been copied outside the SIMM bank being tested.

After the test has been completed, the copied contents of the base memory may be re-copied back to its original location in the tested SIMM bank (physical addresses 0–640 KB). The paging feature of the microprocessor may now be disabled, and the operating system can again begin operating out of the first SIMM bank.

At this point, adjustments may need to be made to logical addresses that were saved during the testing. For example, if a memory failure was identified, its logical address will need to be converted to the actual physical address.

Figure 3A:
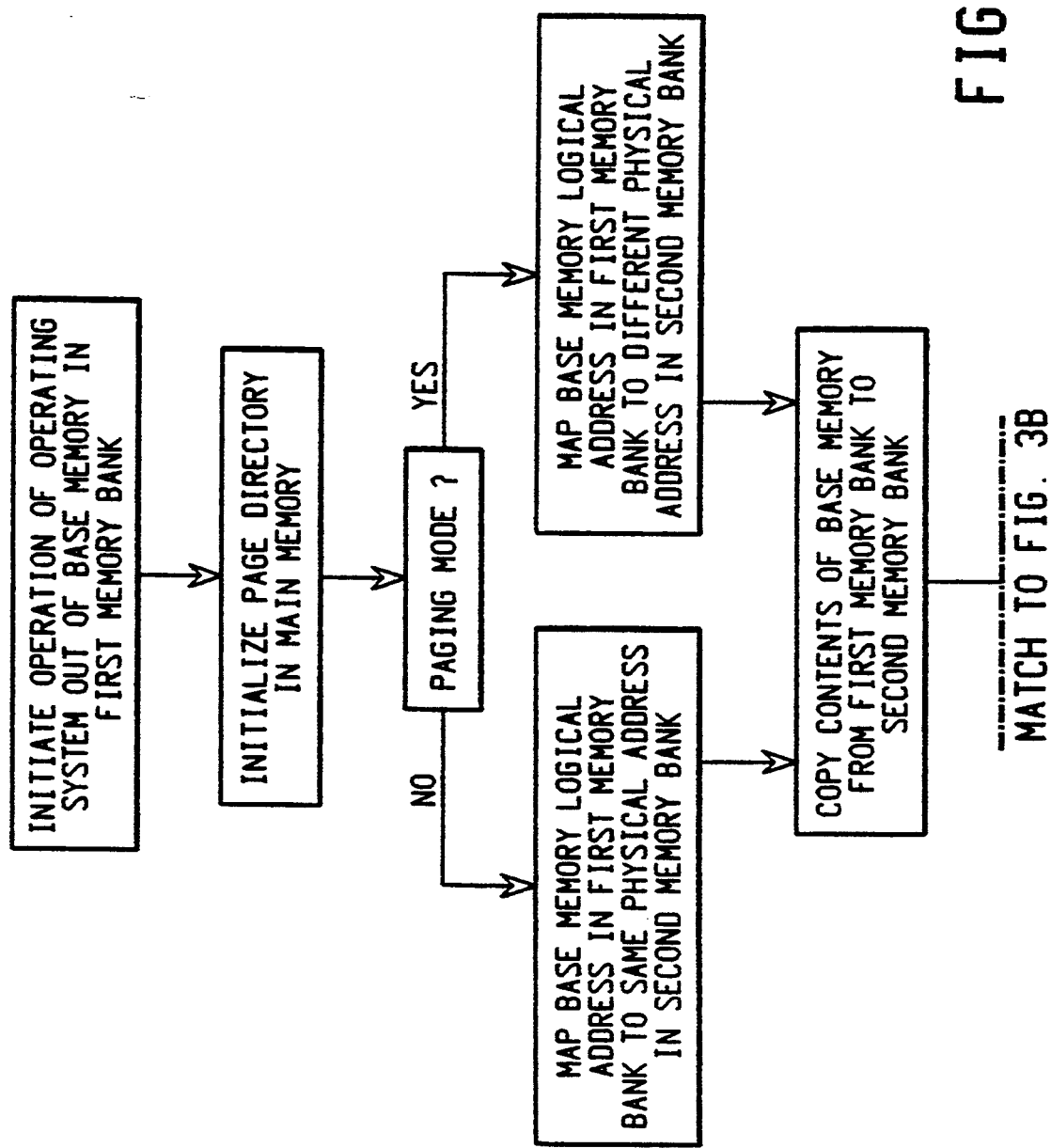
FIGS. 3A and 3B, taken together, show a flow diagram describing the operation of the present invention.
Figure 3B:
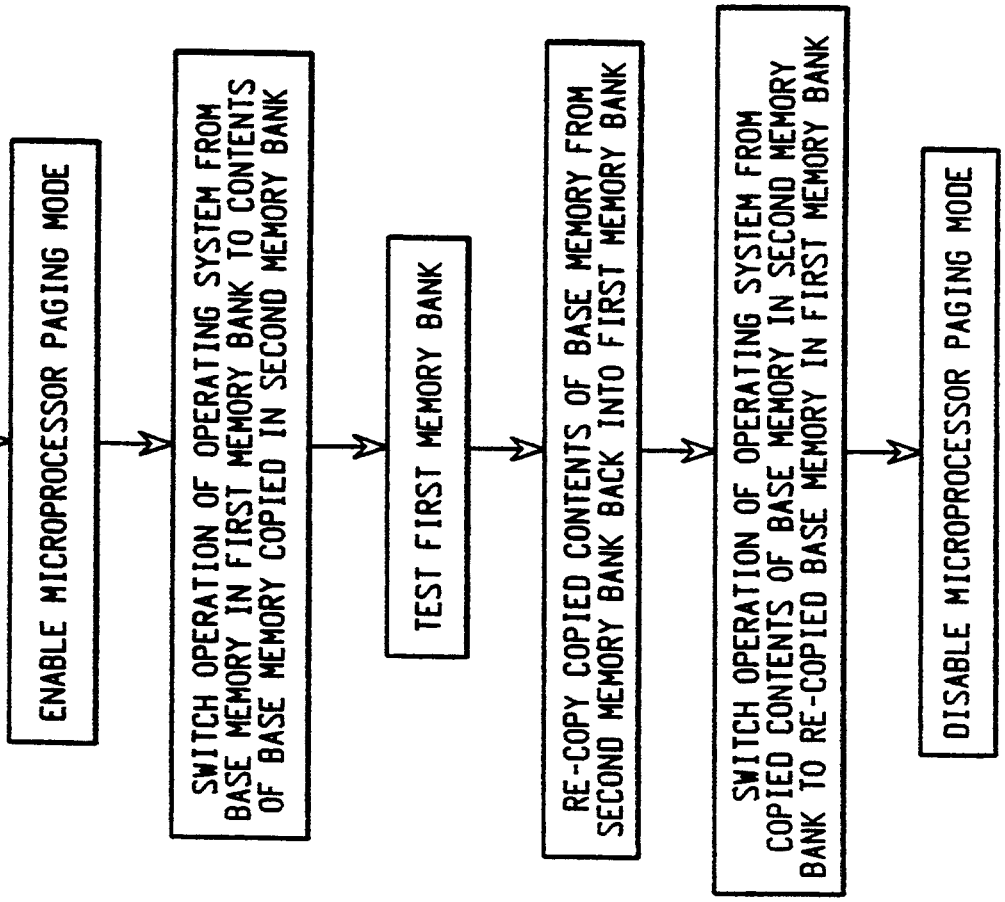

The invention is implemented as a diagnostics program on a reference diskette which contains programs loaded and called to test a particular subsystem. To run the test, the operating system is initialized with the reference diskette and a memory test is chosen from the test menu. The following pseudocode describes the logic necessary for implementing the memory testing mechanism of the present invention into the memory diagnostics of a computer system. For example, in the preferred embodiment, source code corresponding to the following pseudocode is implemented in the memory diagnostics on a reference diskette for the IBM ® PS/2 ® Model 95 486 (50 MHz). The following diagnostic pseudocode (also see FIG. 3A–3B) assumes that the operating system has begun operating out of a first memory bank containing physical address locations 0–640 KB.

1) initialize a page directory in the main memory;
2) create page tables within the directory which (i) maps the same logical addresses (0–640 KB) to physical addresses 2 MB to (2 MB+640 KB) in a paging enabled mode as correspond to physical addresses 0 to 640 KB in a non-paging mode, (ii) maps the same logical addresses (2 MB to (2 MB+640 KB)) to physical addresses 0–640 KB in a paging enabled mode as correspond to physical addresses (2 MB to (2 MB+640 KB)) in a non-paging mode; and (iii) maps all other available addresses ((640 KB+1) to (2 MB−1) in the first memory bank to the same address, i.e. the physical and logical addresses for these available addresses are the same in both paging and non-paging modes of operation;
3) copy the contents of physical addresses (0–640 KB) from the first memory bank to a second memory bank (physical addresses (2 MB to (2 MB+640 KB));
4) enable the paging mode of the microprocessor and begin operating the operating system out of the second memory bank;

5) perform memory diagnostics on physical addresses (0–640 KB) using the logical addresses;
6) re-copy physical addresses (2 MB to (2 MB+640 KB)) in the second memory bank back to physical addresses (0–640 KB) in the first memory bank and;
7) disable the paging function of the microprocessor.

Source code corresponding to the above pseudocode is implemented in memory diagnostics for the computer system to permit complete testing of the memory in which the operating system resides.

Accordingly, the preferred embodiment of a method and system for testing base memory in a computer system has been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

It is claimed:

1. In a computer system, a method for on-line testing a first memory bank containing base memory in which resides at least an operating system for the computer system, said method comprising the steps of:
   (i) initiating operation of said operating system out of said base memory in said first memory bank in a first mode of operation;
   (ii) defining a mapping scheme which establishes a correspondence between physical addresses in said first memory bank and in a second memory bank, and logical addresses which map to said physical addresses in said first and second memory banks; wherein (i) a defined first logical address range for said base memory in said first memory bank is mapped to a first physical address range in said first memory bank in said first mode of operation and is mapped to a second physical address range in said second memory bank in a second mode of operation; and (ii) a defined second logical address range in said first memory bank is mapped to said second physical address range in said first mode of operation and is mapped to said first physical address range in said second mode of operation;
   (iii) copying the contents of said base memory from said first physical address range in said first memory bank to said second physical address range in said second memory bank;
   (iv) switching operation of said operating system from said base memory in said first memory bank, in said first mode of operation, to said contents of said base memory copied in said second memory bank, in said second mode of operation, by accessing said copied contents of said base memory using said defined logical address;
   (v) performing a memory test on said first memory bank using a memory diagnostic program;
   (vi) re-copying said copied contents of said base memory from said second memory bank back into said first memory bank; and
   (vii) switching operation of said operating system from said copied contents of said base memory in said second memory bank, in said second mode of operation to the re-copied base memory in said first memory bank, in said first mode of operation.

2. In a computer system including a microprocessor providing a paging function, a method for testing a first memory bank containing base memory in which resides at least an operating system for the computer system, said method comprising the steps of:
   (i) initiating operation of said operating system out of said base memory in said first memory bank by disabling the paging function of said microprocessor;
   (ii) defining a mapping scheme, by initializing a page directory within microprocessor-controlled memory, which establishes a correspondence between physical addresses in said first memory bank and in a second memory bank, and logical addresses which map to said physical addresses in said first and second memory banks, wherein a defined logical address for said base memory in said first memory bank is mapped to a physical address in said second memory bank;
   (iii) copying the contents of said base memory from said first memory bank to said second memory bank;
   (iv) switching operation of said operating system from said base memory in said first memory bank to said contents of said base memory copied in said second memory bank, by enabling said paging function of the microprocessor and accessing said copied contents of said base memory using said defined logical address;
   (v) performing a memory test on said first memory bank using a memory diagnostic program;
   (vi) re-copying said copied contents of said base memory from said second memory bank back into said first memory bank; and
   (vii) switching operation of said operating system from said copied contents of said base memory in said second memory bank to the re-copied base memory in said first memory bank.

3. The method of claim 2, wherein said microprocessor is a 386-type or 486-type microprocessor.

4. The method of claim 2, wherein said base memory is comprised of single in-line memory modules each of which comprises one or more banks of dynamic random access memory (DRAM) chips.

5. The method of claim 2, wherein said base memory also includes said memory diagnostic program and a diagnostic control program for managing the operation of said memory diagnostic program.

6. The method of claim 5, wherein said memory test comprises writing a predetermined data pattern to all memory locations in said first memory bank and reading back said predetermined data pattern from said first memory bank.

7. The method of claim 2, wherein said operating system is DOS ®.

8. The method of claim 7, wherein said computer system is IBM ® PS/2 ® compatible.

9. The method of claim 8, wherein said base memory comprises up to 640 KB of memory space in said first memory bank.

10. In a computer system, a memory test apparatus for on-line testing a first memory bank containing base memory in which resides at least the memory test apparatus and an operating system for the computer system; said apparatus comprising a memory diagnostic program including means for:
   (i) initiating operation of said operating system out of said base memory in said first memory bank in a first mode of operation;
   (ii) defining a mapping scheme with a microprocessor in the system which establishes a correspondence between physical addresses in said first memory bank and in a second memory bank, and logical addresses which map to said physical addresses in said first and second memory banks; wherein (i) a defined first logical address range for said base memory in said first memory bank is mapped to a first physical address range in said first memory bank in said first mode of operation and is mapped to a second physical address range in said second memory bank in a second mode of operation; and (ii) a defined second logical address range in said first memory bank is mapped to said second physical address range in said first mode of operation and is mapped to said first physical address range in said second mode of operation;

(iii) copying the contents of said base memory from said first physical address range in said first memory bank to said second physical address range in said second memory bank;

(iv) switching operation of said operating system from said base memory in said first memory bank, in said first mode of operation, to said contents of said base memory copied in said second memory bank, in said second mode of operation, by accessing said copied contents of said base memory using said defined logical address;

(v) performing a memory test on said first memory bank using the memory diagnostic program;

(vi) re-copying said copied contents of said base memory from said second memory bank back into said first memory bank; and (vii) switching operation of said operating system from said copied contents of said base memory in said second memory bank, in said second mode of operation to the re-copied base memory in said first memory bank, in said first mode of operation.

11. The test apparatus of claim 10, wherein said microprocessor is provided with a paging function; wherein said mapping scheme is defined by initializing a page directory within said microprocessor; wherein said operating system is operated out of said second memory bank by enabling said paging function of said microprocessor; and wherein said operating system is operated out of said first memory bank by disabling said paging function of said microprocessor.

12. The test apparatus of claim 11, wherein said microprocessor is a 386-type of 486-type microprocessor.

13. The test apparatus of claim 11, wherein said base memory is comprised of single in-line memory modules each of which comprises one or more banks of dynamic random access memory (DRAM) chips.

14. The test apparatus of claim 11, wherein said base memory also includes a diagnostic control program for managing the operation of said memory diagnostic program.

15. The test apparatus of claim 14, wherein said memory comprises writing a predetermined data pattern to all memory locations in said first memory bank and reading back said predetermined data pattern from said first memory bank.

16. The test apparatus of claim 11, wherein said operating system is DOS ®.

17. The test apparatus of claim 16, wherein said computer system is IBM ® PS/2 ® compatible.

18. The test apparatus of claim 17, wherein said base memory comprises up to 640 KB of memory space in said first memory bank.

* * * * *